United States Patent
Ahmed

(10) Patent No.: US 8,189,384 B2
(45) Date of Patent: May 29, 2012

(54) SYSTEM AND METHOD TO CONTROL ONE TIME PROGRAMMABLE MEMORY

(75) Inventor: Sebastian Ahmed, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 0 days.

(21) Appl. No.: 13/026,114

(22) Filed: Feb. 11, 2011

(65) Prior Publication Data

US 2011/0141791 A1  Jun. 16, 2011

Related U.S. Application Data

(62) Division of application No. 12/832,774, filed on Jul. 8, 2010, now Pat. No. 7,911,839, which is a division of application No. 11/726,943, filed on Mar. 23, 2007, now Pat. No. 7,778,074.

(51) Int. Cl.
*G11C 16/04* (2006.01)

(52) U.S. Cl. ......... 365/185.04; 365/189.02; 365/189.03; 365/230.02

(58) Field of Classification Search ............. 365/185.04, 365/189.02, 189.03, 230.02
See application file for complete search history.

(56) References Cited

U.S. PATENT DOCUMENTS

| | | | |
|---|---|---|---|
| 5,336,950 A | 8/1994 | Popli et al. | |
| 5,734,868 A * | 3/1998 | Curd et al. | ............... 365/185.22 |
| 5,734,919 A | 3/1998 | Walsh et al. | |
| 5,867,053 A | 2/1999 | Engles et al. | |
| 6,104,634 A | 8/2000 | Rochard | |
| 6,160,734 A | 12/2000 | Henderson et al. | |
| 6,307,797 B1 | 10/2001 | Fournel et al. | |
| 6,317,368 B1 * | 11/2001 | Taito et al. | ............... 365/189.11 |
| 6,515,923 B1 | 2/2003 | Cleeves | |
| 6,901,000 B1 | 5/2005 | Ichiriu et al. | |
| 7,046,569 B2 | 5/2006 | Ito et al. | |
| 7,102,952 B2 | 9/2006 | Lee et al. | |
| 7,110,322 B2 * | 9/2006 | Farmwald et al. | ........ 365/189.15 |
| 7,529,916 B2 | 5/2009 | Kershaw et al. | |
| 7,652,922 B2 * | 1/2010 | Kim et al. | ................ 365/185.11 |
| 2004/0025011 A1 | 2/2004 | Azema et al. | |
| 2004/0105298 A1 | 6/2004 | Symes | |
| 2004/0114454 A1 * | 6/2004 | Farmwald et al. | ............ 365/233 |
| 2004/0170046 A1 | 9/2004 | Belnet et al. | |
| 2005/0030802 A1 * | 2/2005 | Farmwald et al. | ............ 365/200 |
| 2005/0105366 A1 | 5/2005 | Pedlow, Jr. | |
| 2005/0149896 A1 | 7/2005 | Madurawe | |
| 2006/0117177 A1 | 6/2006 | Buer | |
| 2006/0131743 A1 | 6/2006 | Erickson et al. | |
| 2006/0133167 A1 | 6/2006 | Nakayama et al. | |

(Continued)

OTHER PUBLICATIONS

Requirement for Restriction/Election received from the United States Patent Office (USPTO) for U.S. Appl. No. 11/726,943, mailed Jun. 24, 2009, 8 pages.

(Continued)

*Primary Examiner* — Tuan T. Nguyen

(74) *Attorney, Agent, or Firm* — Toler Law Group, PC

(57) ABSTRACT

A device includes a one-time-programmable memory including multiple random accessible input/output pins. Each random accessible I/O pin corresponds to a unique memory address in the one-time-programmable memory. The device also includes a multiplexing circuit with multiple inputs. Each of the multiple inputs is coupled to one of the multiple random accessible I/O pins. An output of the multiplexing circuit has a bit width that is less than the number of the multiple random accessible I/O pins.

20 Claims, 6 Drawing Sheets

U.S. PATENT DOCUMENTS

2006/0136751 A1    6/2006    Bonaccio et al.
2006/0136858 A1    6/2006    Erickson et al.
2006/0236111 A1    10/2006   Bodensjo et al.

OTHER PUBLICATIONS

Notice of Allowance received from the United States Patent Office (USPTO) for U.S. Appl. No. 11/726,943, mailed Sep. 4, 2009, 7 pages.

Non-Final Office Action received from the United Stated Patent Office (USPTO) for U.S. Appl. No. 11/726,943, mailed Nov. 13, 2009, 12 pages.

Notice of Allowance received from the United States Patent Office (USPTO) for U.S. Appl. No. 11/726,943, mailed Apr. 5, 2010, 6 pages.

Notice of Allowance received from the United States Patent Office (USPTO) for U.S. Appl. No. 12/832,774, mailed Nov. 12, 2010, 7 pages.

TSMC Libraries and IP, <www.tsmc.com>, Taiwan Semiconductor Manufacturing Company, dated Feb. 2006, 4 pages.

International Search Report and Written Opinion received for PCT Application No. PCT/US08/02678 from the International Searching Authority (EPO) mailed Jul. 2, 2008, 11 pages.

\* cited by examiner

SYSTEM AND METHOD TO CONTROL ONE TIME PROGRAMMABLE MEMORY

CLAIM OF PRIORITY

This application is a divisional application of, and claims the benefit of, U.S. patent application Ser. No. 12/832,774, filed Jul. 8, 2010; which is a divisional of U.S. patent application Ser. No. 11/726,943, now U.S. Pat. No. 7,778,074, filed Mar. 23, 2007; and the contents of both are expressly incorporated herein by reference in their entireties.

FIELD OF THE DISCLOSURE

The present disclosure is generally related to systems and methods to control one time programmable memory.

BACKGROUND

One time programmable memory with laser fuses can consume a large area of an integrated circuit. In addition, one time programmable memory with laser fuses are programmed prior to the memory leaving the memory manufacturer. Hence, there is a need for an improved system and method to control one time programmable memory.

DETAILED DESCRIPTION

The disclosure is directed to methods and systems to control one-time-programmable (OTP) memory. In a particular embodiment, a method for an integrated circuit to modify a functionality of the integrated circuit may include determining a functionality for a hardware capability bus in the integrated circuit. The method may also include storing data in a first register of the integrated circuit based on the functionality. The method may also include disabling the functionality in the integrated circuit by setting at least one bit in a OTP memory bank in the integrated circuit based on the data.

In another particular embodiment, an integrated circuit is disclosed that includes a hardware bus with more than one capability. The integrated circuit also includes a first register to store at least one bit to allow a selected capability of the more than one capabilities to be disabled. The integrated circuit also includes an OTP memory to store the at least one bit, the OTP memory allowing the at least one bit to be written only once. The integrated circuit also includes logic to control the OTP memory, the logic operable to determine the at least one bit based on a functionality of the hardware bus. The logic may also be operable to store the at least one bit in the first register. The logic may also be operable to set the at least one bit in the OTP memory.

In yet another particular embodiment, a device is disclosed that includes an OTP memory including multiple random accessible input/output (I/O) pins, wherein each random accessible I/O pin corresponds to a unique memory address in the OTP memory. The device also includes a multiplexing circuit including multiple inputs, each of the multiple inputs is coupled to one of the multiple random accessible I/O pins. The device also may include an output of the multiplexing circuit having a bit width that is less than the number of the multiple random accessible I/O pins.

In still yet another particular embodiment, a computer readable medium having instructions to cause a processor to perform a method is disclosed that includes determining a functionality for a hardware capability bus in the integrated circuit. The method may also include storing data in a first register of the integrated circuit based on the functionality. The method may also include disabling the functionality in the integrated circuit by setting at least one bit in a one-time-programmable (OTP) memory bank in the integrated circuit based on the data.

Figure 1:
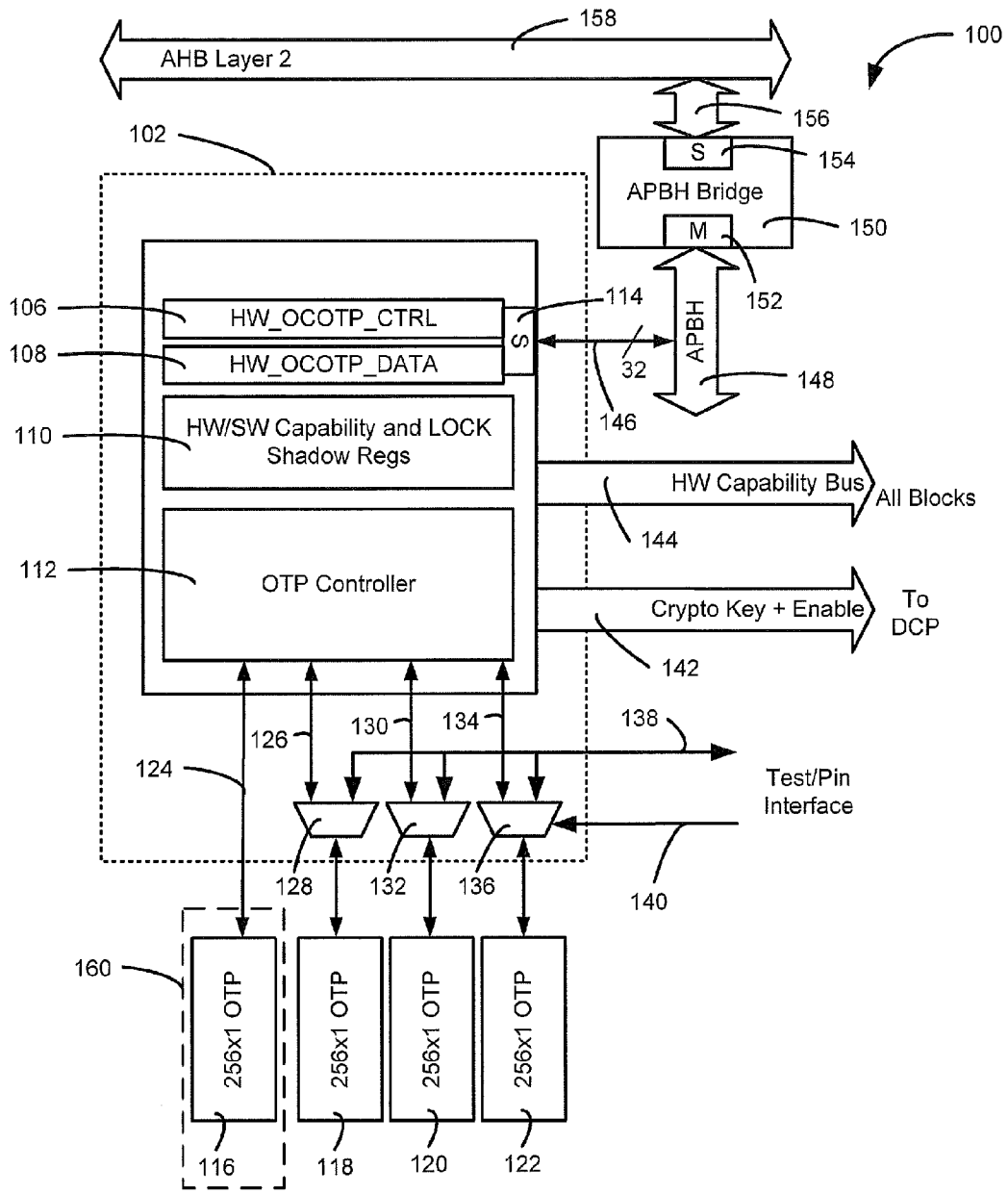
FIG. 1 is a block diagram of a particular illustrative embodiment of a system for controlling one time programmable memory.

Referring to FIG. 1, a block diagram of a particular illustrative embodiment of a system for controlling one time programmable (OTP) memory is depicted and generally designated 100. The system 100 may include a controller 102. The controller 102 may include a control register 106, a data register 108, capability registers 110, and an OTP memory controller 112. In a particular embodiment, the control register 106 may include an address register, a busy register, read bank open register, and an error register. In another particular embodiment, the data register 108 may be a 32-bit data register.

The OTP memory controller 112 may be coupled to a first OTP memory bank 116 via communication line 124, a second OTP memory bank 118 via communication line 126, a third OTP memory bank 120 via communication line 130, and a fourth OTP memory bank 122 via communication line 134. The controller 102 also may include an advanced peripheral bus (APB) slave port 114. The APB slave port 114 may allow access to the control register 106, the data register 108, and the capability registers 110. A central processing unit (CPU) (not shown) may execute instructions to access the control register 106, the data register 108, and the capability registers 110 via the APB slave port 114. The controller 102 also may include a first multiplexer 128, a second multiplexer 132, and a third multiplexer 136. The controller 102 also may include chip-level pin access 138 coupled to the first multiplexer 128, the second multiplexer 132, and the third multiplexer 136. The controller 102 also may include selection input 140 coupled to the first multiplexer 128, the second multiplexer 132, and the third multiplexer 136.

In a particular embodiment, the controller 102 may be coupled to a hardware capability bus 144. In addition, the controller 102 may be coupled to a security bus 142. The controller 102 may be coupled to an APB 148 via communication line 146. The APB 148 may be coupled to an APB bridge 150. The APB bridge 150 may include a master port 152 and a slave port 154. The APB bridge 150 may be coupled to an advanced high-speed bus (AHB) 158 via bus 156.

Figure 3:
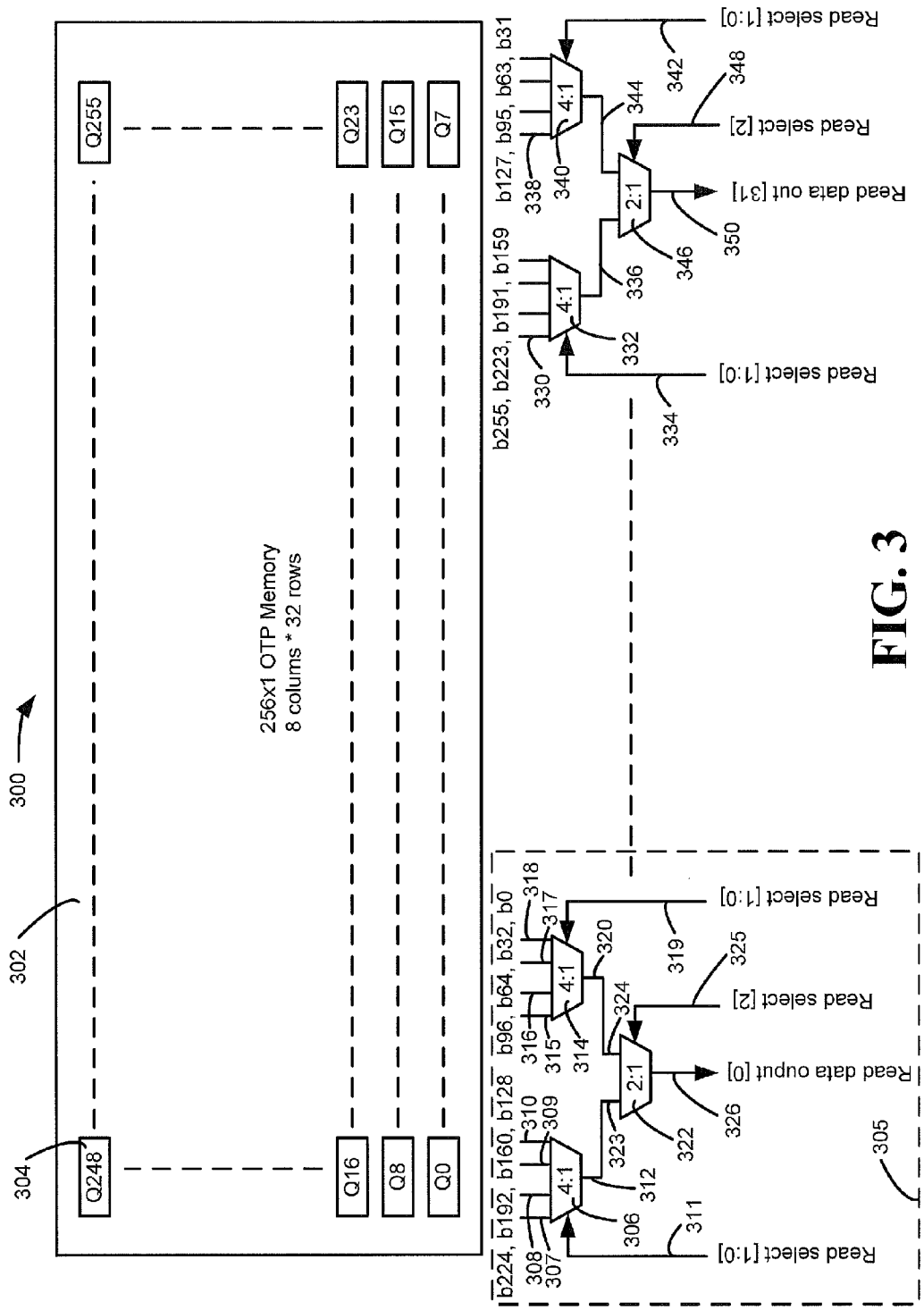
FIG. 3 is a block diagram of a particular illustrative embodiment of a system for controlling one time programmable memory.

In a particular embodiment, a system 160 may include the OTP memory bank 116 and may include logic for allowing pin level access to the memory locations of the OTP memory bank 116. For example, the system 160 may include multiplexing logic, such as shown in FIG. 3. In addition, the OTP memory banks 118, 120, and 122 may also each be included in a system, such as system 160, where each system includes logic for allowing pin level access to the memory locations of the corresponding OTP memory bank, such as shown in FIG. 3.

During operation, controller 102 provides restricted access to OTP memory banks 116, 118, 120, and 122. In a particular embodiment, the controller 102 provides 32-bit word restricted access to one kilobyte of OTP read only memory (ROM) via the APB 148. The controller 102 may provide data-register access for programming the contents of OTP memory banks 116, 118, 120, and 122. In a particular embodiment, all data words of the OTP memory banks 116, 118, 120, and 122 are memory mapped on the APB 148.

In a particular embodiment, during memory mapping of the OTP memory banks 116, 118, 120, and 122, there are two types of memory mapping. The first type of memory mapping may be a direct mapping where the CPU can read directly from the OTP memory banks 116, 118, 120, and 122 after initiating a bank read opening sequence. The second type of memory mapping may be via shadow registers. For example, the contents of OTP memory bank 122 (0x08-0x0F) and the first word of OTP memory bank 120 (0x10) may be copied into shadow registers. When the CPU attempts to access these locations of the OTP memory banks 120 and 122, the CPU may read the memory mapped contents of the shadow registers corresponding to these locations. In addition, before the functionality is locked out, the CPU can write to the OTP locations of the shadowed registers and follow that up with a shadow registers re-loading operation (also done via software). This will make the controller 102 copy the contents and "refresh" the shadow registers.

In a particular embodiment, the controller 102 loads and stores bits representative of hardware and/or software capabilities in the capability registers 110. The controller 102 may generate bits for the hardware capability bus 144 based on the capability registers 110. The controller 102 may also send cryptography keys and a read enable signal over security bus 142. In a particular embodiment, the controller 102 sends a 128-bit cryptography key 32-bits at a time over four clock cycles. The controller 102 may also provide chip-level pin access via the chip-level pin access 138 to un-restricted portions of the OTP memory banks 116, 118, 120, and 122.

In a particular embodiment, pin access to OTP memory bank 116 may not be allowed. OTP memory bank 116 may contain customer programmable cryptographic keys. In another particular embodiment, there may not be a hardware connection to the OTP memory bank 116.

In a particular embodiment, read operations and write operations to the OTP memory banks 116, 118, 120, and 122 may be performed on 32-bit words. For the write operations, the 32-bit word is a write mask, wherein the bit fields with a "0" will not be programmed and the bit fields with a "1" will be programmed.

In a particular embodiment, a read operation may be performed by a software read sequence. This may occur when the data words of the OTP memory banks 116, 118, 120 and 122 are memory mapped to registers on the APB space. These registers may be read-only, except for the capability registers 110, which are writeable until after an appropriate lock bit in the OTP memory banks 116, 118, 120 or 122 is set. In a particular embodiment, a LOCK register for storing the lock bits may also be writeable until a particular lock bit is set in that register. That is, the LOCK register can have a lock bit for itself.

In a particular embodiment, a request to read data from one of the OTP memory banks 116, 118, 120, and 122 may be received at the controller 102. In a particular embodiment, the OTP memory banks 116, 118, 120 and 122 must be open before they can be read. That is, a read mode must be enabled to allow data to be read from the OTP memory banks 116, 118, 120. However, a read request corresponding to data previously stored in the shadow registers may not need the OTP memory banks 116, 118, 120, and 122 opened prior to allowing the CPU to access the data stored in the shadow registers.

In a particular embodiment, enabling the read mode may include programming the clock frequency for the OTP memory banks 116, 118, 120, and 122 to a frequency. The frequency may be within an allowable frequency range for the chip as specified by a manufacturer. In a particular embodiment, the clock frequency is set between a minimum frequency and a maximum frequency. In a particular embodiment, the maximum frequency may be 200 megahertz (MHz). In a particular embodiment, a hardware clock (HCLK) of the OTP memory banks 116, 118, 120, and 122 may be adjusted up to a frequency of 200 MHz. In a particular embodiment, the maximum allowable HCLK frequency may be less than 200 MHz.

Enabling the read mode may also include checking the control register 106 to determine if there are any read or write requests pending. In a particular embodiment, determining if there are any read or write requests pending may be accomplished by checking if a busy bit is set. Enabling the read mode may also include checking the control register 106 to determine of there are any read or write access errors. In a particular embodiment, determining read or write access errors may be accomplished by checking if an error bit is set. In a particular embodiment, the OTP controller 102 may check that a busy register and an error register in the control register 106 are clear. The busy register may comprise a busy bit to indicate a read or write pending status. Setting the busy bit may indicate that a read or write request is pending.

Enabling the read mode may also include setting a read open bit in the control register 106 to put the OTP memory banks 116, 118, 120, and 122 into the read mode. Once the read open bit is set, the OTP memory controller 112 may put the OTP memory banks 116, 118, 120, and 122 into read mode. If there is a pending write, that is the busy bit is set, and the read open bit is set, the OTP memory controller 112 may complete the write and immediately move into a read operation. The OTP memory controller may then poll the control register to determine when the busy register is clear. When the busy register is clear, and the read bank open register is set, the data from the appropriate memory mapped address may be read.

In a particular embodiment, a busy bit may be set by the OTP memory controller 112 in the control register 106 when a read or write request is received. When the busy bit is clear and the read open bit is set, data may be read from a memory mapped address. In a particular embodiment, the OTP memory controller 112 may set the read open bit in the control register 106. The OTP memory controller 112 will set the busy register in the control register 106 until the OTP memory banks 116, 118, 120, and 122 are readable. In a particular embodiment, reading the data from the memory mapped address prior to the busy bit being cleared may result in the error bit being set. Once the data is read, the read open bit is cleared and the read mode is no longer enabled. In a particular embodiment, leaving the OTP Memory banks 116, 118, 120, and 122 in the read mode may cause a current drain from a power source.

In a particular embodiment, enabling a read mode of the OTP memory banks 116, 118, 120, and 122 takes approximately 33 clock cycles, thus immediate polling to check if the busy bit is set is not recommended.

In another particular embodiment, a full parallel mapping may be implemented. The full parallel mapping may include mapping the entire OTP memory banks 116, 118, 120, and 122 contents directly to a system addressable memory.

In another particular embodiment, a serial output (not shown) of the OTP memory banks 116, 118, 120, and 122 may be used to access data stored in the OTP memory banks 116, 118, 120, and 122. In operation, an address may be stored in an address register in the OTP controller 112. A flag may be set in a controller status register to signify a busy state. In a particular embodiment, the flag may be monitored by a processor to check when the busy state is clear. The OTP controller 112 may shift data serially out of at least one of the OTP memory banks 116, 118, 120, and 122 into a data register. In a specific embodiment, the OTP memory controller 112 may serially shift data until a maximum number of bits in the data register has been reached. In a particular embodiment, the maximum number of bits may be thirty two (32). When the data register is full, the flag may be cleared. When the flag is clear, the processor may read the data from the data register.

In a particular embodiment, registers that are shadowed may not need to enable the read mode because the shadow registers may be directly accessed without opening the OTP memory banks for reading.

In a particular embodiment, if a read attempt is attempted on a protected region of the OTP memory banks 116, 118, 120, and 122 once a lock bit corresponding to the protected region has been set, the OTP memory controller 112 may return an error status. In addition, the error register in the control register 106 may be set and the requested data may not be returned. Instead, an error message, such as 0xBADA_BADA, may be returned. In a particular embodiment, the error register must be cleared by software before any new write access may be issued. In a particular embodiment, subsequent read requests to un-restricted addresses of the OTP memory banks 116, 118, 120, and 122 may still be performed. In a particular embodiment, the protected region of the OTP memory banks 116, 118, 120, and 122 may contain a cryptographic key.

In another embodiment, a request to write data to an address of the OTP memory banks 116, 118, 120, and 122 may be received by the OTP memory controller 112. In a particular embodiment, an unlocking sequence may be used for write operations to avoid rogue or malicious code from performing an erroneous write to the OTP memory banks 116, 118, 120, and 122.

In a particular embodiment, a write operation may include adjusting the HCLK frequency to a frequency associated with writing data to the OTP memory banks 116, 118, 120, and 122. In a particular embodiment, the write frequency may be twenty-four (24) MHz. In another particular embodiment, the write frequency may be up to thirty-one (31) MHz.

A write operation may also include adjusting an operating voltage for the OTP memory banks 116, 118, 120, and 122 to a programming voltage. In a particular embodiment, the programming voltage is greater than the operating voltage. In a particular embodiment, the operating voltage may be the core-voltage, and has a range of about 1.08V to about 1.45V, but typically may be 1.2V. The programming voltage connects to the input/output (I/O) voltage, VDDIO, which may be about 2.7V.

A write operation may also include checking the busy register and the error register of the control register 106 to determine if they are not set. In a particular embodiment, any pending write operation must be completed before a write access may be requested. In another particular embodiment, the OTP memory banks 116, 118, 120, and 122 can not be open for reading during a write operation, thus the read open register in the control register 106 must also be clear.

A write operation may also include programming the address requested for the write in the address register of the control register 106. An unlock code may be programmed in a write unlock register of the control register 106. In a particular embodiment, the data to be written is a programming mask. The OTP memory controller 112 may use the programming mask to program a data word in the OTP memory banks 116, 118, 120, and 122 per the address stored in the address register. In a particular embodiment, the data word is a 32-bit data word.

In a particular embodiment, when the write operation is accepted by the OTP memory controller 112, the OTP memory controller 112 may make a copy of the address in the address register. In a particular embodiment, the copy of the address register may not be updated until a next write sequence is initiated. In a particular embodiment, the copy of the address register may be stored internally in the OTP memory controller 112. The copy of the address register may provide protection such that erroneous or malicious writes to the address register do not affect an active write operation.

In a particular embodiment, the data stored in the data register 108 may be shifted right, with zero fill, to program the OTP memory banks 116, 118, 120, and 122 serially. In a particular embodiment, during a write operation, the data in the data register 108 may not be modified. In a particular embodiment, the data is shifted one bit per every 32 HCLK cycles. In a particular embodiment, a write latency for a location of a word may be calculated by:

$$\text{write latency} = tHCLK * N_{HCLK} * B_w * n;$$

where tHCLK equals an amount time for an HCLK cycle;
$N_{HCLK}$ equals the number of clock cycles to shift a bit of a data word;
$B_w$ equals the number of bits in a data word; and
n equals a data word location in the OTP memory bank.
In a particular embodiment, $N_{HCLK}=32$, $B_w=32$, and $0 \leq n \leq 7$.

In a particular embodiment, the OTP memory controller 112 may clear the busy register when the data from the data register 108 has been stored in the OTP memory banks 116, 118, 120, and 122.

In a particular embodiment, a write request to a protected region of the OTP memory banks 116, 118, 120, and 122 may result in the error register being set, resulting in not receiving access to the OTP memory banks 116, 118, 120, and 122 and the busy register not being set. This may occur when a write request to a protected region of the OTP memory banks 116, 118, 120, and 122 is received by the OTP memory controller 112. In a particular embodiment, the error register may only be cleared by software and before any new write access can be issued.

In a particular embodiment, the OTP memory controller 112 may also generate the hardware capability bus 144. The hardware capability bus 102 may be generated via a direct connection to the capability registers 110. The capability registers 110 may also be referred to as shadow registers. In a particular embodiment, data may be copied from the OTP memory banks 116, 118, 120, and 122 to the capability registers 110 upon a reset. In a particular embodiment, the capability registers 110 may be modified until a capability register lock bit has been set.

In a particular embodiment, a user may force a reload of the capability registers 110 without having to reset the system 100. This may be accomplished by setting a reload capability register and waiting for the OTP memory controller 112 to clear the busy register and the reload capability register.

In a particular embodiment, the reload capability register can be set at any time. Thus, there is no need to wait for the busy register or the error register to be clear. When the reload capability register is set during an active write operation, the OTP memory controller 112 may open the OTP memory banks 116, 118, 120, and 122 and reload the capability registers 110 immediately after the completion of the active write operation.

In a particular embodiment, the OTP memory controller 112 may clear the reload capability register after a successful reloading of the capability registers 110. In a particular embodiment, the error register may be set when a write operation is performed to the capability register 110 during a reload or when a write operation is performed to a shadow register that has been locked.

Figure 2:
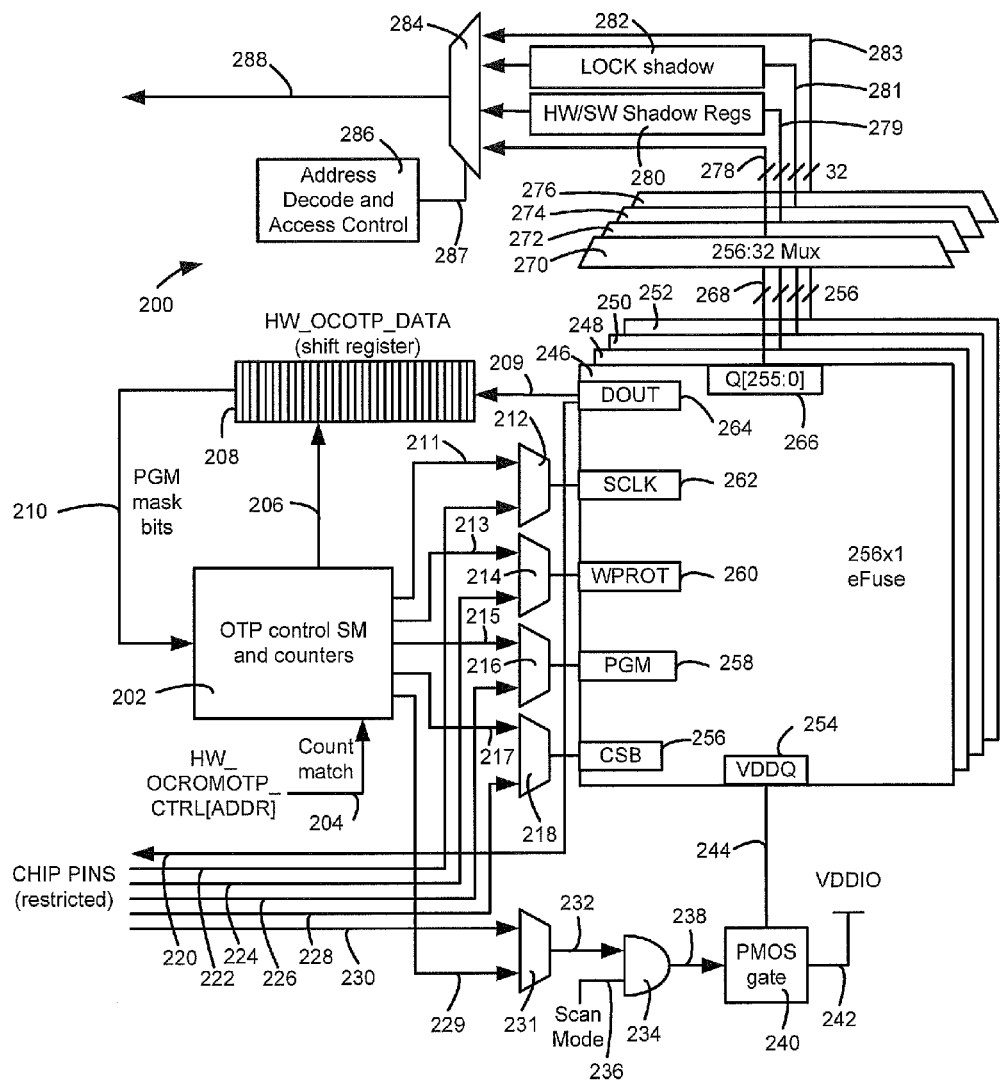
FIG. 2 is a block diagram of a particular illustrative embodiment of a system for controlling one time programmable memory.

Referring to FIG. 2, a block diagram of a particular illustrative embodiment of a system for controlling one time programmable memory is disclosed and generally designated 200. The system 200 includes an OTP memory controller 202. The OTP memory controller 202 may include a control signal output 211 coupled to a shift clock input 262 of OTP memory bank 246 via multiplexer 212. In addition, the OTP memory controller 202 may include a control signal output 213 coupled to a write protect input 260 of OTP memory bank 246 via multiplexer 214. In addition, the OTP memory controller 202 may include a control signal output 215 coupled to a program input 258 of OTP memory bank 246 via multiplexer 216. In addition, the OTP memory controller 202 may include a control signal output 217 coupled to a chip select input 256 of OTP memory bank 246 via multiplexer 218.

The OTP memory controller 202 may also include a control signal output 229 coupled to multiplexer 231. The multiplexer 231 may have an output 232 coupled to logic 234. In a particular embodiment, logic 234 is an AND gate with a scan mode input 236. The logic 234 may include an output 238 coupled to a P-channel metal-oxide-semiconductor (PMOS) gate 240. The PMOS gate 240 may have a voltage input 242 and a voltage output 244 coupled to a voltage input 254 of the OTP memory bank 246.

In a particular embodiment, the voltage input 242 may be about 2.7 volts (V) and the output 244 of the PMOS gate 240 coupled to the voltage input 254 may be about 2.5V. The PMOS gate 240 may comprise a voltage level shifter where a control signal via output 238 may be a VDDD (1.2V) signal and the PMOS gate 240 may be a VDDIO (2.7-3.3 V) device.

In a particular embodiment, each OTP memory bank 246, 248, 250, and 252 may have a shift clock input, a write protect input, a program input, and a chip select input coupled to OTP memory controller 202. Also, each OTP memory bank 246, 248, 250, and 252 may have a voltage input coupled to the PMOS gate 240. In addition, each OTP memory bank 246, 248, 250, and 252 may have a data output coupled to the data register 208.

In a particular embodiment, the OTP memory controller 202 may include a state machine and counters. The OTP memory controller 202 may also include an input 204 from an address register. Also, the OTP memory controller 202 may include an output 206 to a data register 208. The data register 208 may have a data input 209 coupled to a data output 264 of the OTP memory bank 246. The data register 208 may also have a data output 210 coupled to the OTP memory controller 202.

In a particular embodiment, data output line 220 and control lines 222, 224, 226, 228, and 230 are coupled to pins that allow chip-level access to the OTP memory banks 246, 248, 250, and 252.

In a particular embodiment, the OTP memory controller 246 may have a data output 266. The data output 266 may be coupled to a data bus 268. In a particular embodiment, the data bus may be a 256-bit data bus. The data output 268 may be coupled to multiplexer 270. In a specific embodiment, the multiplexer 270 may have an output coupled to a data bus 278. In a particular embodiment, each OTP memory bank 246, 248, 250, and 252 may have an output coupled to a multiplexer 270, 272, 274, or 276. Also, each multiplexer 270, 272, 274, or 276 may be coupled to a data output 278, 279, 281, or 283.

In a particular embodiment, a shadow register 280 may be coupled to the data output 279 and also coupled to an input of a multiplexer 284. The shadow register may be used for loading data from an OTP memory to provide access to the data without the need to open the OTP memory bank 248 for reading. In one particular embodiment, the shadow register 280 may store data that determines the hardware and/or software capability of a system coupled to the shadow register. In another particular embodiment, the shadow register 280 may store data that determines a capability of a system-on-a-chip (SoC) device that the system 200 resides in. Also, a data register 282 may be coupled to the data output 281 and also coupled to an input of the multiplexer 284. The multiplexer 284 may also have the data output 278 coupled to an input and the data output 283 coupled to input. The multiplexer 284 may also be coupled to a control line 287 that may be coupled to a selection logic 286. The multiplexer 284 may have a data output 288. In a particular embodiment, the selection logic 286 may be a controller or processor.

During operation, the OTP memory controller 202 may send control signals via control signal outputs 211, 213, 215, and 217 to control the OTP memory banks 246, 248, 250, and 252, such as described with reference to FIG. 1 and FIG. 5.

In a particular embodiment, the OTP memory controller 202 may copy data associated with the shadow registers 280 from the OTP memory banks 246, 248, 250, and 252 to the shadow registers 280. In a particular embodiment, the OTP memory controller 202 may allow software controlled reloading of the shadow registers 280.

In a particular embodiment, a scan mode may be enabled via scan mode input 236. During scan mode, the voltage input 254 may be driven to low to protect against unwanted writes to the OTP memory banks 246, 248, 250, and 252. In addition, hardware capability bits are forced to zeroes. The shadow register 280 flops and drives the bus. In a particular embodiment, observable flops may be added to catch faults in logic of the OTP memory controller 202.

In a particular embodiment, the data output line 220 and control lines 222, 224, 226, 228, and 230 are coupled to pins that allow chip-level access to the OTP memory banks 246, 248, 250, and 252 during a test mode. The chip-level access may be enabled when a select pin interface line 230 is high and a lock pin register is in a not locked state. When these conditions are met, the chip-level access may have priority over any requests generated via the OTP memory controller 202. In a particular embodiment, the error register may be set and may not be cleared until the select pin interface line 230 is asserted to low. In a particular embodiment, at least one of the OTP memory banks 246, 248, 250, and 252 may not be connected to the chip-level pin access. This may be done for security purposes.

Referring to FIG. 3, a block diagram of a particular illustrative embodiment of a system for controlling one time programmable memory is disclosed and generally designated 300. The system 300 may include an OTP memory bank 302 having a memory location 304. In a particular embodiment, the OTP memory bank 302 may be a 256-bit memory bank with 256 memory locations.

In a particular embodiment, the system 300 may include a first set of multiplexers 305. The first set of multiplexers 305 may include a first multiplexer 306, a second multiplexer 314, and a third multiplexer 322. In a particular embodiment, the first multiplexer 306 may include a first input 307, a second input 308, a third input 309, and a fourth input 310. Each of the first input 307, the second input 308, the third input 309, and the fourth input 310 may be connected to parallel data output pins (not shown) of the OTP memory bank 302, where each parallel data output pin corresponds to a memory location of the OTP memory bank 302. The first multiplexer 306 may also include a control line input 311. The control line input 311 may allow for the selection of either the first input 307, the second input 308, the third input 309, or the fourth input 310 to be received at an output 312 of the first multiplexer 306.

In a particular embodiment, the second multiplexer 314 may include a first input 315, a second input 316, a third input 317, and a fourth input 318. Each of the first input 315, the second input 316, the third input 317, and the fourth input 318 may be connected to parallel data output pins (not shown) of the OTP memory bank 302, where each parallel output pin corresponds to a memory location of the OTP memory bank 302. The second multiplexer 314 may also include a control line input 319. The control line input 319 may allow for the selection of either the first input 315, the second input 316, the third input 317, or the fourth input 318 to be received at an output 320 of the second multiplexer 314.

In a particular embodiment, the third multiplexer 322 may include a first input 323 coupled to the output 312 of the first multiplexer 306. The third multiplexer 322 may also include a second input 324 coupled to the output 320 of the second multiplexer 314. The third multiplexer 322 may also include a control line input 325. The control line input 325 may allow for selection of either the first input 322 or the second input 324 to be received at an output 326 of the third multiplexer 322. In a particular embodiment, the control line input 311, the control line input 319, and the control line input 325 may be coupled to control logic, such as a processor or controller.

In a particular embodiment, there may be more than one set of multiplexers. In another particular embodiment, a number of selected output pins may be based on an available bit-width of a data bus coupled to the system 300. In a further particular embodiment, the system 300 multiplexes two hundred fifty six (256) parallel data outputs of the OTP memory bank 302 to select thirty two (32) outputs to be provided to a data bus. In yet a further particular embodiment, the number of sets of multiplexers may be equal to a width of a data bus coupled to the system 300.

During operation, an input may be received at the control line 311 to select one of the first input 307, the second input 308, the third input 309, and the fourth input 310 to be received at the output 312 of the first multiplexer 306. An input may also be received at the control line 319 to select one of the first input 315, the second input 316, the third input 317, and the fourth input 318 to be received at the output 320 of the second multiplexer 314. Then, an input may be received at the control line 325 to select the output 326 to be provided to a data bus coupled to the system 300. In a specific embodiment, thirty two (32) data bits are output from the multiple multiplexer sets to the data bus per read operation.

In a particular embodiment, the OTP memory bank 302 may include a serial output pin (not shown) for reading data from each memory location of the OTP memory bank 302 in a serial mode.

Figure 4:
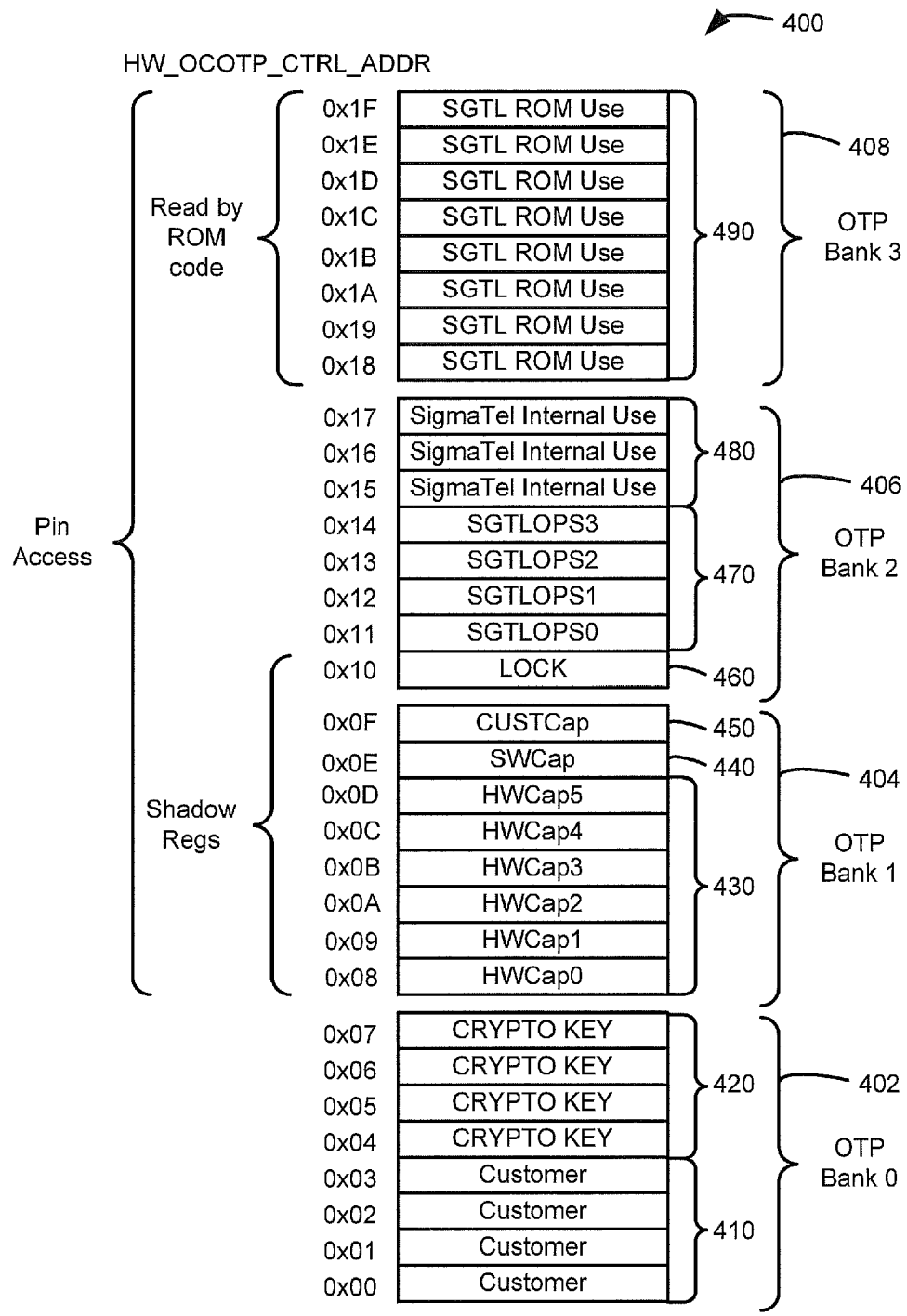
FIG. 4 is a block diagram of a particular illustrative embodiment of a system for allocating memory of one time programmable memory.

Referring to FIG. 4, a block diagram of a particular illustrative embodiment of a system for allocating memory of one time programmable memory is depicted and generally designated 400. The system 400 may include a first OTP memory bank 402, a second OTP memory bank 404, a third OTP memory bank 406, and a fourth OTP memory bank 408. In a particular embodiment, each OTP memory bank may store eight 32-bit data words.

In a particular embodiment, the first OTP memory bank 402 may include a first reserved portion 410 and a second reserved portion 420. In a particular embodiment, the first reserved portion 410 may be allocated to store data bits to be used by a customer's device (not shown) coupled to the system 400. In another particular embodiment, the first reserved portion 410 may store four 32-bit data words.

In another particular embodiment, the second reserved portion 420 may allocated to store data bits for a cryptographic key. In a particular embodiment, a cryptographic key may be stored in the second reserved portion 420 after manufacture of a chip including the system 400. In a particular embodiment, the second reserved portion 420 may be programmed with a cryptographic key by a customer. In a particular embodiment, the second reserved portion 420 may be programmed with a cryptographic key after a chip including the system 400 has been coupled to another device. In yet another particular embodiment, the second reserved portion 420 may encompass all of the first OTP memory bank 402. In a particular embodiment, the second reserved portion 420 may store four 32-bit data words.

In a particular embodiment, the second OTP memory bank 404 may include a third reserved portion 430, a fourth reserved portion 440, and a fifth reserved portion 450. In a particular embodiment, the third reserved portion 430 may be allocated to store data bits related to enabling or disabling hardware capabilities of a device coupled to the system 400. In another particular embodiment, the third reserved portion 430 may be allocated to store data bits related to enabling or disabling a hardware capability of a SoC device that includes the system 400. In a particular embodiment, the third reserved portion 430 may store six 32-bit data words.

In a particular embodiment, the fourth reserved portion 440 may be allocated to store data bits related to enabling or disabling a software capability of a device coupled to the system 400. In another particular embodiment, the fourth reserved portion 440 may be allocated to store data bits related to enabling or disabling a software capability of a SoC device that includes the system 400. In a particular embodiment, the fourth reserved portion 440 may store one 32-bit data word.

In a particular embodiment, the fifth reserved portion 450 may be allocated to store data bits for enabling and/or disabling customer specific capabilities. In a particular embodiment, the fifth reserved portion 450 may store one 32-bit data word.

In a particular embodiment, the third OTP memory bank 406 may include a sixth reserved portion 460, a seventh reserved portion 470, and an eighth reserved portion 480. In a particular embodiment, the sixth reserved portion 460 may be allocated to store lock bits to indicate whether a data word in the system 400 has been written. In a particular embodiment, if a lock bit corresponding to a specific data word is set to a "1" value, the system 400 will not allow the specific data word to be written. In a particular embodiment, the sixth reserved portion 460 may store one 32-bit data word.

In a particular embodiment, the seventh reserved portion 470 may be allocated to store operational bits of a SoC device that includes the system 400. In a particular embodiment, the seventh reserved portion 470 may store data bits for configuring the SoC, such as when the SoC is powered on or reset. In a particular embodiment, the seventh reserved portion 470 may store four 32-bit data words.

In a particular embodiment, the eighth reserved portion 480 may be reserved for internal use by a manufacturer. In a particular embodiment, the eight reserved portion 480 may store three 32-bit data words.

In a particular embodiment, the fourth OTP memory bank 408 may include a ninth reserved portion 490. In a particular embodiment, the ninth reserved portion 490 may be allocated to store data bits for internal use of an SoC device. The ninth reserved portion 490 may be allocated to store operating code of an SoC device including the system 400. In another particular embodiment, the ninth reserved portion 490 may be programmed during manufacture of the SoC device and may be available as a read-only-memory (ROM) during operation of the SoC device. In a particular embodiment, the ninth reserved portion 490 may store eight 32-bit data words.

In a particular embodiment, the ninth reserved portion 490 may store data that can be used by on-chip ROM code. For example, code which is executed from ROM at startup may read contents of the ninth reserved portion 490 to determine from which interface it should determine the boot mode of the device. Thus, there may be portions in the ninth reserved portion 490 that a customer may program so that they can customize how the device boots. For example, one customer may boot from SPI-flash and another may want to boot from NOR-flash.

In a particular embodiment, data bits from the OTP memory banks 402, 404, 406, and 408 may be read from their respective OTP memory banks and stored in a register external to system 400. The data bits may be stored in the register to allow access to data stored in those reserved portions without the need to read the data bits from the respective OTP memory banks during a read request.

In another particular embodiment, the OTP memory banks 402, 404, 406, and 408 may allow direct pin access by a device, such as an SoC, that includes the system 400.

Figure 5:
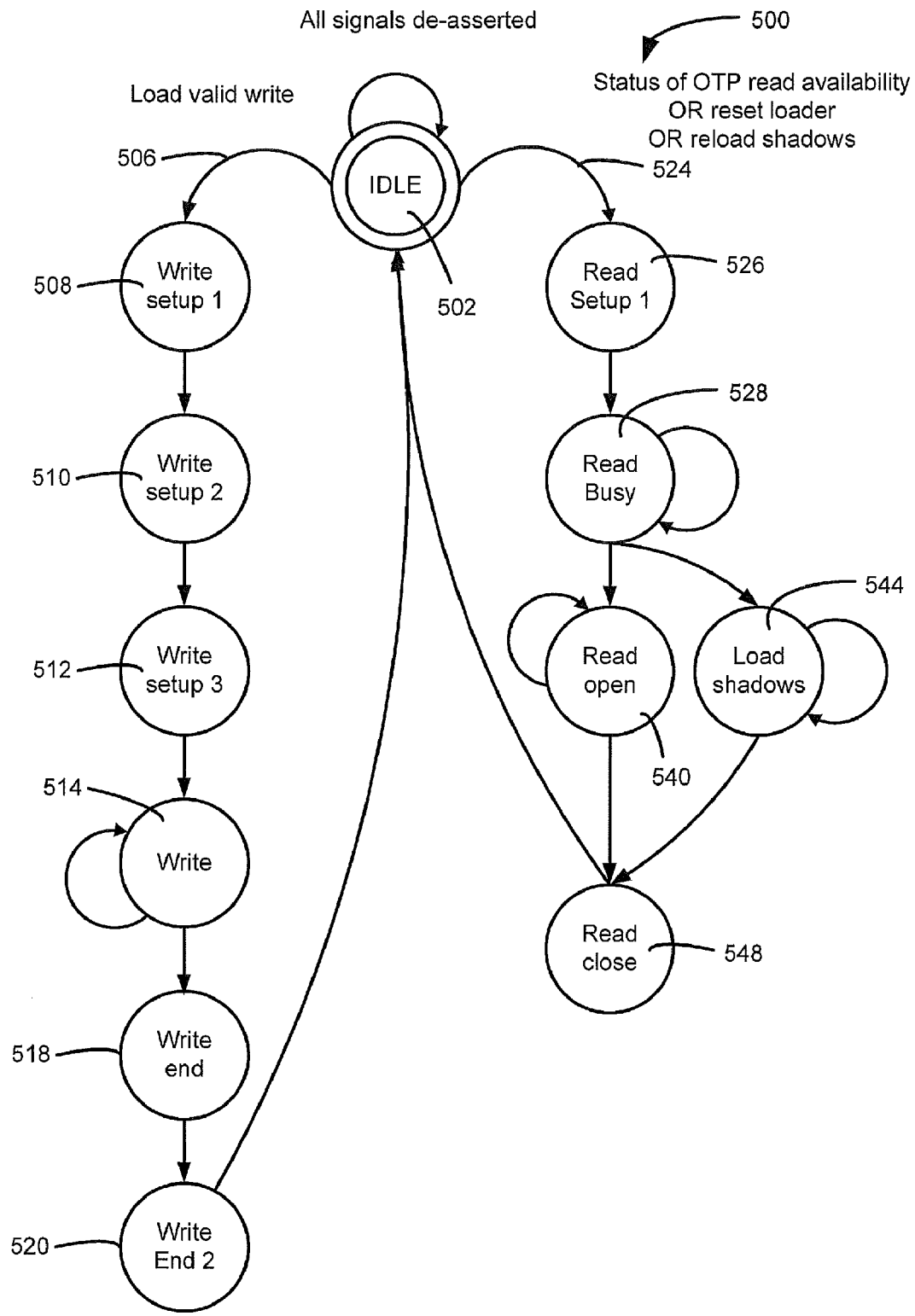
FIG. 5 is a diagram of operational states of a system to control memory operations.

Referring to FIG. 5, a particular embodiment of operational states of a system to control memory operations is depicted and generally designated 500. The operational states of the system 500 are used to perform programming, read, and copy operations on a system with OTP memory, such as the system 100. The operational states of the system 500 may include an idle state 502, a first write setup state 508, a second write setup state 510, a third write setup state 512, a write state 514, a first write end state 518, a second write end state 520, a read setup state 526, a read busy state 528, a read open state 540, a load shadow register state 544, and a read close state 548. In a particular embodiment, the operational states 500 may be logical states of a controller, such as controller 102.

In a particular embodiment, during the idle state 502 all control signals are de-asserted. The control signals may include a voltage input control signal (VDDQ), a chip select control signal (CSB), a shift clock control signal (SCLK), a program control signal (PGM); and a write protect control signal (WPROT). In a particular embodiment, the control signals are de-asserted when the VDDQ is low, the CSB is high, the SCLK is low, the PGM is low, and the WPROT is high.

When a write command is received, at 506, the first write setup state 508 may be entered. During the first write setup state 508, the write command may be asserted by setting the VDDQ to high, the PGM to high, and the WPROT to low. The first write setup state 508 may be held for a setup time. In a particular embodiment, the setup time may be long enough to allow an operating voltage of the memory to be ramped up to a write voltage. In a particular embodiment, the write voltage may be 2.5 volts. In a particular embodiment, during the first write setup state 508, a busy register indicating that a write operation may be executed is set with a value of "1".

After the setup time has passed, the first write setup state 508 may transition to the second write setup state 510. During the second write setup state 510, the CSB may be asserted to low. The second write setup state 510 may continue until the PGM returns to low.

From the second write setup state 510, the operation may proceed to the third write setup state 512. The third write setup state may hold the operation for a timer period and until the PGM may be asserted high.

From the third write setup state 512, the operation may proceed to the write state 514. The write state 514 may enable the SCLK, the PGM, and shifting logic operations and counters. The write state 514 may be where the SCLK and the PGM may be toggled. At each rising edge of the SCLK, the OTP memory bank may be programmed when the PGM is high. In a particular embodiment, programming of the OTP memory bank may be done in order of the memory addresses from 0 to 255.

In a particular embodiment, the shifting of a data register holding the bits to be stored may operate as follows. First, a shift clock counter may start at value 0 and increment each rising edge of an APB clock. The PGM may be held low until the shift clock counter equals the contents of an address register (ADDR) multiplied by 32:

$$SCLK\text{ count}=ADDR*32.$$

In a particular embodiment, the address register may be an address register for storing an address that data may be written to. Then, the PGM may connect to a data register holding the data to be written. The data register may shift on each falling edge of the SCLK, which may be essentially each time the shift clock counter overflows. The PGM may be held low and the shifting may end when the shift clock counter equals a maximum count calculated by the ADDR multiplied by 32 plus 32:

$$SCLK\text{ count}=(ADDR*32)+32.$$

In a particular embodiment, once the maximum count has been reached the operation proceeds to the first write end state 518. The first write end state 518 may include de-asserting the SCLK and waiting a predetermined time.

In a particular embodiment, the operation may then proceed to the second write end state 520 where the CSB may be de-asserted. The operation may be held in the second write end state 520 until the VDDQ may be de-asserted and the WPROT may be asserted to high. During the second write end state 520, the busy register may be cleared to a "0" value. The write operation may then end and the system 500 may return to the idle state 502.

In a particular embodiment, when a read command is received, at 524, the read setup state 526 may be entered and the busy register may be set to "1". In a particular embodiment, the read command may be received by setting a read bank open register to "1". In another particular embodiment, the read command may be received by setting a reload shadow register to "1". In another particular embodiment, the read command may be received by de-asserting a chip reset. In a particular embodiment, the chip reset may be an internal hardware bit that may be set when the hardware is reset and causes the system 500 to enter the read setup state 526.

The read setup state 526 may assert the SCLK high and may wait a setup time. When the setup time has expired, the read busy state 528 may be entered and the CSB may be asserted low. The read busy state then may wait an amount of time. In a particular embodiment, the amount of time may be 32 cycles.

In a particular embodiment, the system 500 may then enter the read open state 540. In the read open state 540, the SCLK may be held at high to allow data to be read from memory locations. Once in the read open state 540, the busy register may be cleared to "0" to instruct software that the memory banks are available for reading. The read open state 540 may be maintained until the read bank open register is cleared to "0". In a particular embodiment, the read bank open register may be cleared by software. In a particular embodiment, the read open state applies to all the memory banks and all APB registers that are directly mapped to the memory banks may be read during this time.

In another particular embodiment, instead of entering the read open state, the system 500 may enter the load shadow register state 544. The load shadow register state 544 may be entered after the system 500 has been reset or upon a forced re-loading of a shadow register via software.

The read close state 548 may be entered when the read bank open register is cleared to "0". During the read close state 548, the SCLK may be asserted to low and a time period may be waited. After the time period has expired, the idle state 502 may be entered and the CSB may be asserted high.

Figure 6:
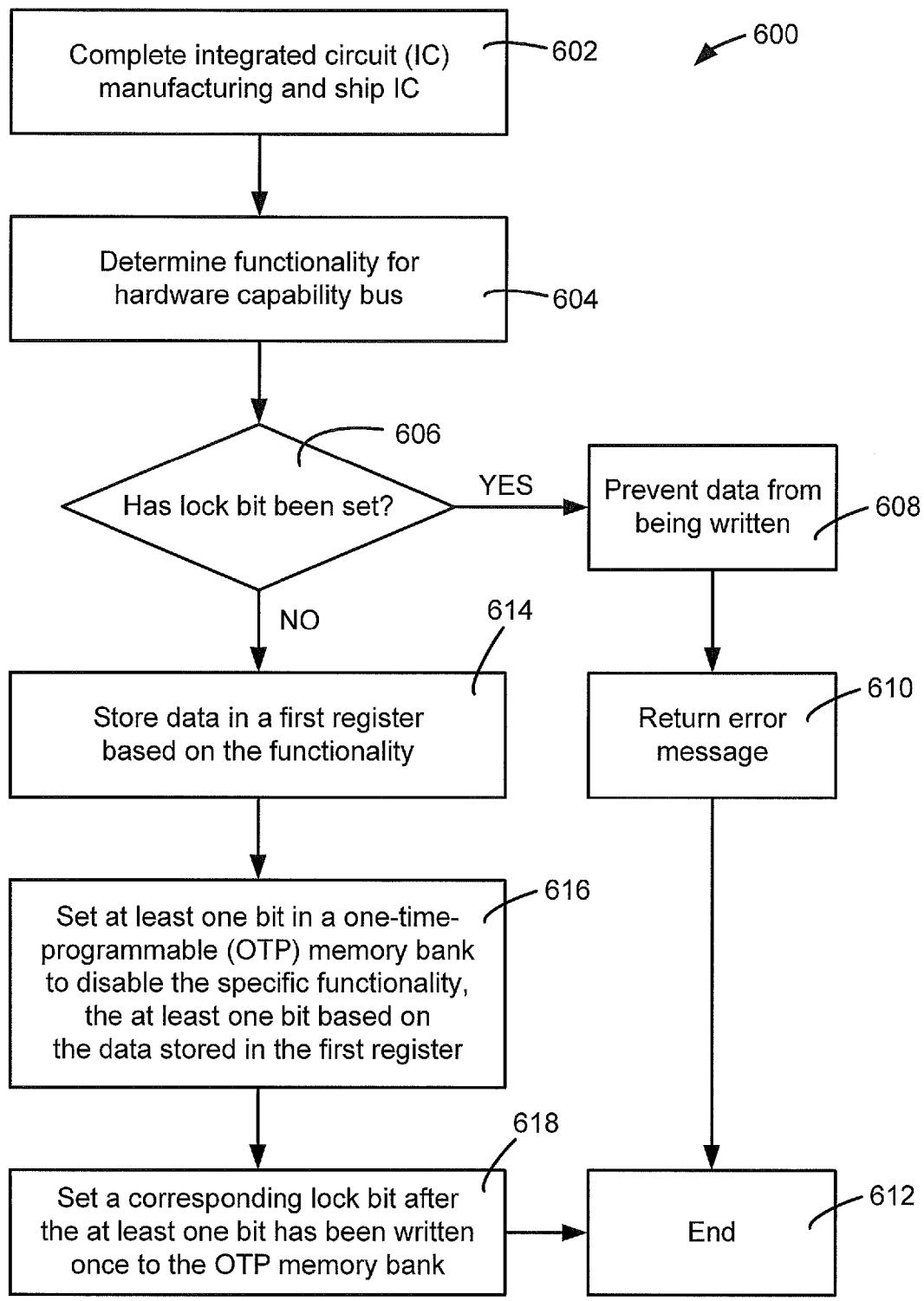
FIG. 6 is a flow chart depicting a particular illustrative embodiment of a method to control one time programmable memory.

Referring to FIG. 6, a flow chart of a particular illustrative embodiment of a method to control one time programmable memory is depicted and generally designated 600. The method includes determining a functionality for a hardware capability bus, at 604. In a particular embodiment, determining the functionality may comprise receiving an input to identify the functionality. In a particular embodiment, the hardware capability bus may be a hardware capability bus internal to an integrated circuit. In a particular embodiment, the hardware capability bus may be a hardware capability bus that may determine a functionality of a device coupled to an integrated circuit or a device including an integrated circuit.

In a particular embodiment, the method may also include determining if a lock bit has been set, at 606. When the lock bit has been set, the data may be prevented from being written, at 608. When a write request has been denied, an error message may be returned, at 610. In a particular embodiment, the error message may be a bit being set in a register to signify an error. After the error message has been returned, the method may end, at 612.

The method also includes, storing data in a first register based on the functionality when the lock bit has not been set, at 614. In a particular embodiment, the data may be a data programming mask. The method may also include setting at least one bit in a one-time-programmable (OTP) memory bank to disable the functionality, the at least one bit based on the data in the first register, at 616.

In a particular embodiment, setting the at least one bit may further comprise setting a clock of the OTP memory bank to a frequency, raising a first voltage of the OTP memory bank to a first level, determining if the OTP memory bank is in a read state, and setting the at least one bit in the OTP memory bank when the clock is at the frequency, the first voltage is at the first level, and the OTP memory bank is not in a read state. In a particular embodiment, the first level comprises a voltage level greater than an operating voltage of the OTP memory bank, the operating voltage for reading data from the OTP memory bank.

The method may also include setting a corresponding lock bit after the at least one bit in the OTP memory bank has been written once to the OTP memory bank to disable functionality, at 618. In a particular embodiment, the lock bit may be a lock bit in a register. When the lock bit has been set, the method may end, at 612.

In a particular embodiment, the method may include completing a manufacture of an integrated circuit, at 602. The method may also include shipping the integrated circuit, at 602.

While specific systems and components of systems have been shown, it should be understood that many alternatives are available for such systems and components. In a particular illustrative embodiment, for example, an audio signal processing system may include hardware, software, firmware, or any combination thereof to perform functions and methods of operation as described. It should be understood that particular embodiments may be practiced solely by a processor executing processor instructions and accessing a processor readable memory, or in combination with hardware, firmware, software, or any combination thereof.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

Although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments which fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A device comprising:
   a one-time-programmable (OTP) memory including multiple random accessible input/output (I/O) pins, wherein each random accessible I/O pin corresponds to a unique memory address in the OTP memory; and
   a multiplexing circuit including multiple inputs, each of the multiple inputs is coupled to one of the multiple random accessible I/O pins, wherein an output of the multiplexing circuit has a bit width that is less than the number of the multiple random accessible I/O pins.

2. The device of claim 1, wherein the OTP memory further comprises a serial output pin that allows random access to each unique memory address in the OTP memory.

3. The device of claim 2, wherein the multiplexing circuit further comprises:
   multiple first level multiplexers, each first level multiplexer having multiple inputs that are each coupled to one of the multiple random accessible I/O pins, each first level multiplexer having a first level output;
   multiple second level multiplexers, each second level multiplexer having two inputs that are each coupled to one first level output, each second level multiplexer having a second level output;
   wherein the output of the multiplexing circuit is comprises each second level output; and
   wherein a data bus is coupled to the output of the multiplexing circuit.

4. The device of claim 1, wherein the OTP memory further comprises multiple OTP memory banks, each OTP memory bank having 256 random accessible I/O pins and wherein the multiplexing circuit further comprises multiple outputs, wherein each of the multiple outputs corresponds to one of the multiple memory banks and each of the multiple outputs has a 32 bit width.

5. The device of claim 4, further comprising logic coupled to each of the multiple outputs; wherein the logic dynamically selects one of the multiple outputs to provide data to a data bus.

6. The device of claim 4, wherein a first OTP memory bank includes a cryptographic key.

7. The device of claim 6, wherein the cryptographic key is set after a semiconductor device that includes the device is coupled to another device.

8. The device of claim 4, wherein a first OTP memory bank includes data bits related to enablement or disablement of a hardware capability of a system-on-chip device that includes the device.

9. The device of claim 4, wherein a first OTP memory bank includes data bits related to enablement or disablement of a software capability of a second device coupled to the device.

10. The device of claim 4, wherein a first OTP memory bank includes data bits set by a manufacturer of the device.

11. The device of claim 1, further comprising a register to store lock bits, wherein the lock bits indicate which portions of the OTP memory have been written to once.

12. The device of claim 1, further comprising system addressable memory, wherein contents of the OTP memory are parallel mapped to the system addressable memory.

13. The device of claim 1, further comprising a control register, wherein a busy bit of the control register indicates when there is a pending read or write request.

14. The device of claim 13, wherein a read open bit in the control register is set by a controller to place the OTP memory in a read mode.

15. A method comprising:
    receiving at least one signal from multiple random accessible input/output (I/O) pins of a one-time-programmable memory at inputs of a multiplexing circuit, wherein each of the inputs is coupled to one of the multiple random accessible I/O pins; and
    providing an output from the multiplexing circuit to a data bus, wherein the output has a bit width that is less than the number of the multiple random accessible I/O pins.

16. The method of claim 15, wherein the multiplexing circuit receives a plurality of control line inputs.

17. The method of claim 15, wherein the one-time-programmable memory includes multiple one-time-programmable memory banks.

18. The method of claim 15, further comprising reading a portion of the one-time-programmable memory via a serial output pin that allows random access to each unique memory address in the one-time-programmable memory.

19. The method of claim 15, further comprising providing contents of the one-time-programmable memory to a system addressable memory via the data bus.

20. The method of claim 15, further comprising allowing a write operation to change a portion when a register that stores lock bits indicates that a write to the portion of the one-time-programmable memory has not previously occurred.

* * * * *